(12) United States Patent
Sekine et al.

(10) Patent No.: US 7,429,722 B2
(45) Date of Patent: Sep. 30, 2008

(54) PATTERN LAYOUT OF CMOS IMAGE SENSOR

(75) Inventors: Hirokazu Sekine, Fujisawa (JP); Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 11/402,976

(22) Filed: Apr. 13, 2006

(65) Prior Publication Data
US 2006/0231739 A1 Oct. 19, 2006

(30) Foreign Application Priority Data
Apr. 15, 2005 (JP) ............... 2005-118752

(51) Int. Cl.
H04N 3/14 (2006.01)
H01L 27/00 (2006.01)
(52) U.S. Cl. ............ 250/208.1; 348/302; 348/308
(58) Field of Classification Search ............ 250/208.1; 348/294, 302, 308
See application file for complete search history.

(56) References Cited

U.S. PATENT DOCUMENTS

| 6,091,449 | A | 7/2000 | Matsunaga et al. |
| 6,674,470 | B1 | 1/2004 | Tanaka et al. |
| 6,900,480 | B2 * | 5/2005 | Sugiyama .......... 257/222 |
| 6,977,684 | B1 * | 12/2005 | Hashimoto et al. .......... 348/294 |
| 2001/0052941 | A1 | 12/2001 | Matsunaga et al. |
| 2004/0113151 | A1 | 6/2004 | Sekine |

FOREIGN PATENT DOCUMENTS

CN 1233806 A 11/1999

OTHER PUBLICATIONS

Keiji Mabuchi, et al., "CMOS Image Sensors Comprised of Floating Diffusion Driving Pixels With Buried Photodiode", IEEE Journal of Solid-State Circuits, vol. 39, No. 12, Dec. 2004, pp. 2408-2416.

* cited by examiner

Primary Examiner—Thanh X. Luu
Assistant Examiner—Brian J Livedalen
(74) Attorney, Agent, or Firm—Oblon, Spivak, McClelland, Maier & Neustadt, P.C.

(57) ABSTRACT

A solid-state image pickup device comprises pixels and output circuits. The pixels are arranged two-dimensionally with a vertical and a horizontal, with pixels vertically adjacent to each other forming a pair. The output circuits are provided so as to extend from the spacing part of a pair of pixels vertically adjacent to each other to the spacing part of a pair of pixels horizontally adjacent to the pair of pixels. The output circuits output information corresponding to the signal charge read from a selected one of the pair of pixels. A unit cell is composed of a pair of pixels vertically adjacent to each other and an output circuit corresponding to the pair of pixels. Such unit cells are arranged in a checkered pattern. One of the pair of pixels in a unit cell diagonally adjacent to the pair of pixels is arranged in the same horizontal line.

20 Claims, 10 Drawing Sheets

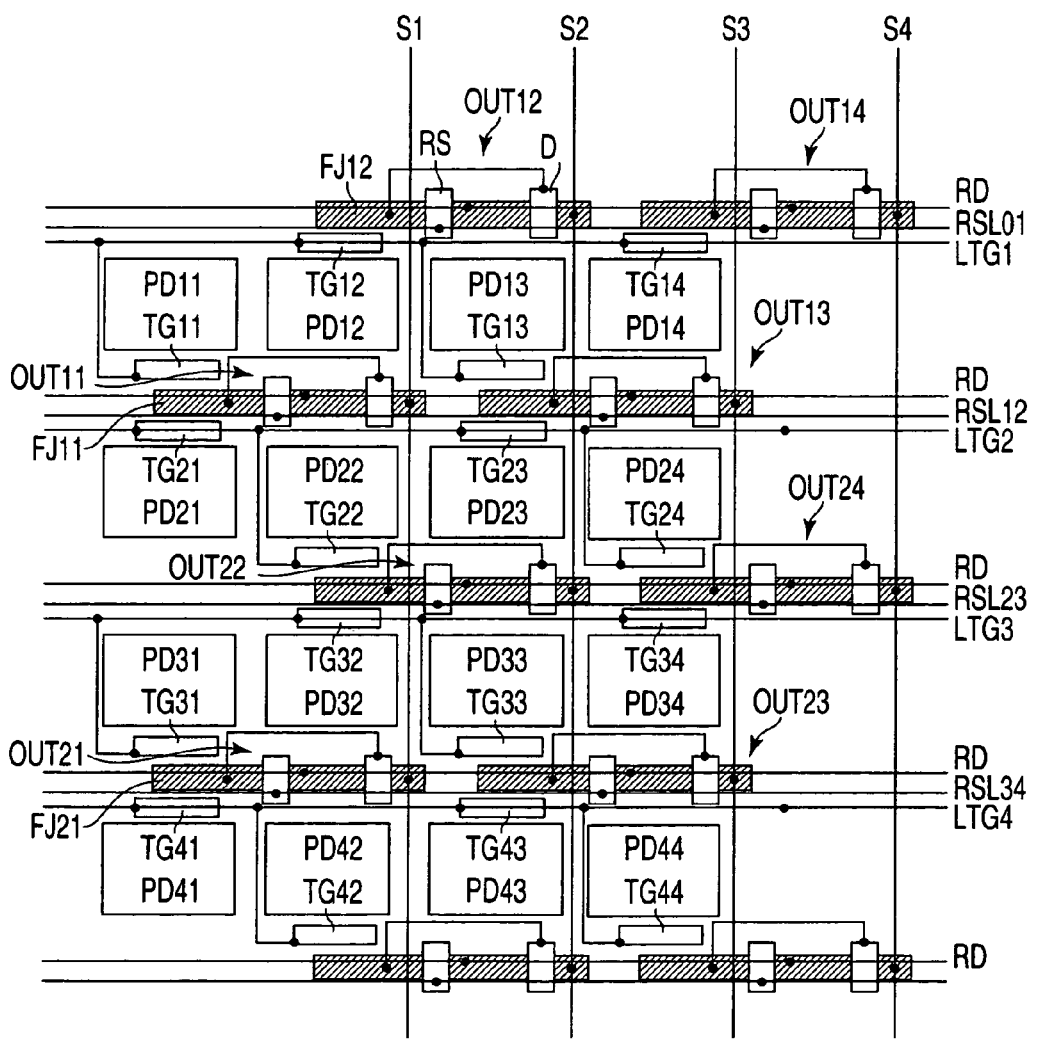
F I G. 3

PATTERN LAYOUT OF CMOS IMAGE SENSOR

CROSS-REFERENCE TO RELATED APPLICATIONS

This application is based upon and claims the benefit of priority from prior Japanese Patent Application No. 2005-118752, filed Apr. 15, 2005, the entire contents of which are incorporated herein by reference.

BACKGROUND OF THE INVENTION

1. Field of the Invention

This invention relates to a solid-state image pickup device, such as a CMOS image sensor, and, more particularly to, a pattern layout for achieving high integration in the horizontal direction of the solid-state image pickup device.

2. Description of the Related Art

In digital cameras and camera phones, a CMOS image sensor is used as an image pickup device. A low-voltage, low-power-consumption CMOS image sensor suitable for this type of device has been described in, for example. U.S. Pat. No. 6,091,449. In the CMOS image sensor, unit cells are arranged in a matrix. Each of the unit cells is composed of photodiodes corresponding to pixels, a transfer transistor, a reset transistor, an address transistor, and a driving transistor.

The photodiodes are arranged in a square-lattice pattern. The signal charges generated and accumulated at these photodiodes are transferred to the floating junctions and are accumulated there. The transfer of the signal charge is carried out by supplying a transfer pulse to the gate of the transfer transistor (or the transfer gate) to form a channel (or open the transfer gate). At this time, the transfer gates arranged in the same row to which a transfer pulse is supplied are also opened, with the result that the signal charges at the photodiodes connected to these transfer gates are also transferred to the floating junctions.

Before the transfer of the signal charge, the potential at each floating junction has been initialized (or reset) to a reset drain voltage by the reset transistor. The voltage level of the floating junction varies as a result of the signal charge flowing in the floating junction. The floating junction is connected to the gate of a driving transistor (or driving gate). A variation in the potential of the floating junction causes the channel potential to be modulated.

Then, an address signal is supplied to the gate of the address transistor (or the address gate), thereby connecting the driving transistor whose channel potential is modulated to a signal line. Load transistors are connected to these signal lines. A signal corresponding to the signal charge is output from a horizontal read circuit to the outside in a time-series manner.

After the reading of one line has been completed, the floating junctions are reset again to the reset drain voltage. Thereafter, the transfer gates are opened, thereby transferring the signal charges generated and accumulated at the photodiodes to the floating junctions. Then, the above-described operations are repeated, thereby reading one line of signal charges.

The signal charges at the photodiodes in the next pixel line and those at the photodiodes in the pixel line after the next are read by sharing the floating junctions. The same operations as described above are repeated, thereby reading all of the pixels.

In U.S. Pat. No. 6,091,449, two pixels vertically arranged share an output circuit. Specifically, the signal charges at two photodiodes arranged adjacently in the vertical direction are transferred to a common floating junction and are read by the output circuit. Therefore, this configuration is suitable for high integration.

Although the configuration is suitable for high integration in the vertical direction, it is difficult to achieve high integration in the horizontal direction because pixels and output circuits are arranged in the horizontal direction. When the configuration is applied to a digital camera, the pixel pitch in the horizontal direction must be made equal to the pixel pitch in the vertical direction. Therefore, even if only either the horizontal pitch or the vertical pitch is reduced, high integration cannot be realized. Moreover, information on the spacing between pixels in the horizontal direction corresponding to the output circuit cannot be acquired.

Furthermore, in the conventional image sensor, since the pixels and output circuits are arranged in the horizontal direction, the opening for the pixels is vertically long. Even in a CCD area sensor, since there are CCD registers in the horizontal direction of the pixels, the opening for the pixels is also vertically long.

In general, the horizontal-to-vertical ratio of the optical system of a camera is 3:4, that is, horizontally long. Therefore, when the pixels in the peripheral part of the light-sensitive surface are considered, light coming in through the lens and entering the light-sensitive surface of the sensor enters the end of the pixels in the horizontal direction more diagonally than the end of the pixels in the vertical direction. Accordingly, the output of the peripheral pixels is less than that of the pixels in the central part, resulting in so-called shading. As described above, when the opening for the pixels is vertically long, the light-sensitive surface is more liable to be affected by shading.

BRIEF SUMMARY OF THE INVENTION

According to an aspect of the present invention, there is provided a solid-state image pickup device comprising: a group of pixels where pixels are arranged two-dimensionally with a specific vertical pitch and a specific horizontal pitch, with pixels vertically adjacent to each other forming a pair; and a group of output circuits each of which is provided so as to extend from the spacing part of a pair of pixels vertically adjacent to each other to the spacing part of a pair of pixels horizontally adjacent to the pair of pixels and which is configured to output information corresponding to the signal charge read from the selected one of the pair of pixels to the outside, wherein unit cells each composed of a pair of pixels vertically adjacent to each other and an output circuit corresponding to the pair of pixels are arranged in a checkered pattern and one of the pair of pixels in a unit cell diagonally adjacent to the pair of pixels is arranged in the same horizontal line.

BRIEF DESCRIPTION OF THE SEVERAL VIEWS OF THE DRAWING

FIG. 3 is a diagram to help explain a solid-state image pickup device according to a second embodiment of the present invention, showing a plan view of another concrete pattern layout of the CMOS image sensor of FIG. 1;

DETAILED DESCRIPTION OF THE INVENTION

FIRST EMBODIMENT

Figure 1:
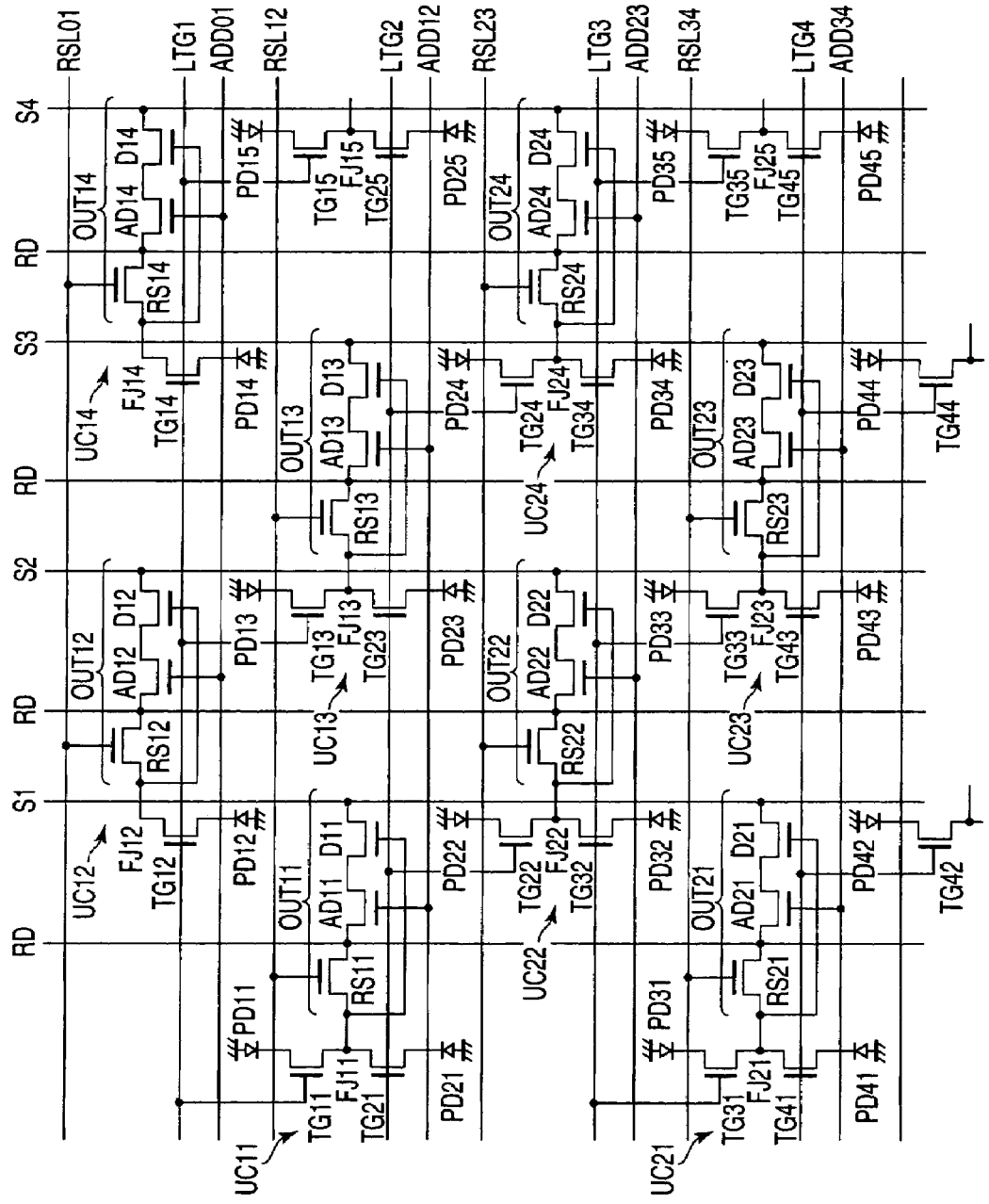
FIG. 1 is a circuit diagram to help explain a solid-state image pickup device according to a first embodiment of the present invention, showing a configuration of the main part of a CMOS image sensor.

FIG. 1 is a circuit diagram to help explain a solid-state image pickup device according to a first embodiment of the present invention, showing a configuration of the main part of a CMOS image sensor. In the CMOS image sensor, each of unit cells UC11 to UC24 is composed of two pixels and one output circuit. These unit cells UC11 to UC24 are arranged in a checkered pattern. Of the units cells arranged in a checkered pattern, four pixels arranged side by side in one line and four output circuits corresponding to these four pixels form a repeat unit.

Each unit cell UC includes a pair of photodiodes (or a photodiode pair) PD serving as pixels, a pair of transfer transistors (or a transfer transistor pair) TG which controls the transfer of signal charge at the pair of photodiodes PD to a floating junction FJ, and an output circuit OUT. The photodiodes PD in the unit cells UC diagonally adjacent to each other are arranged in the same horizontal line. The output circuit OUT includes a reset transistor RS, an address transistor AD, and a driving transistor D.

Photodiodes PD11 to PD45 are arranged two-dimensionally with a specific horizontal pitch and a specific vertical pitch. The photodiodes vertically adjacent to each other makes a pair. Each of the output circuits OUT11 to OUT24 is shared by a pair of photodiodes vertically adjacent to each other (or a photodiode pair). These output circuits OUT11 to OUT24 are arranged in a staggered manner in the spacing between photodiodes making a pair in the vertical direction.

Next, the configuration of one repeat unit will be explained in detail. For the sake of avoiding repetition, the third line (photodiodes PD31, PD32, PD33, PD34) is taken as an example. Photodiode pairs PD31, PD41 correspond to the output circuit OUT21. Photodiode pairs PD22, PD32 correspond to the output circuit OUT22. Photodiode pairs PD33, PD43 correspond to the output circuit OUT23. Photodiode pairs PD24, PD34 correspond to the output circuit OUT24. The photodiodes PD31, PD32, PD33, PD34 are provided with transfer gates TG31, TG32, TG33, TG34, respectively, in such a manner that the latter are adjacent to the former respectively, thereby controlling the transfer of signal charge to floating junctions FJ21, FJ22, FJ23, FJ24.

The output circuit OUT21 is composed of a driving transistor D21, an address transistor AD21, and a reset transistor RS21 in such a manner that their current paths are connected in series with one another. The output circuit OUT22 is composed of a driving transistor D22, an address transistor AD22, and a reset transistor RS22 in such a manner that their current paths are connected in series with one another. The output circuit OUT23 is composed of a driving transistor D23, an address transistor AD23, and a reset transistor RS23 in such a manner that their current paths are connected in series with one another. The output circuit OUT24 is composed of a driving transistor D24, an address transistor AD24, and a reset transistor RS24 in such a manner that their current paths are connected in series with one another. A reset drain RD acts as the drains of the address transistors AD21, AD22, AD23, AD24. The sources of the driving transistors D21, D22, D23, D24 are connected to signal lines S1, S2, S3, S4, respectively.

The basic driving method of the CMOS image sensor is the same as that of a conventional equivalent. When a transfer pulse is supplied to a read line LTG3, the signal charges from the photodiodes PD31, PD32, PD33, PD34 are transferred simultaneously to the floating junctions FJ21, FJ22, FJ23, FJ24 of two rows of the output circuits OUT21, OUT22, OUT23, OUT24 diagonally adjacent to one another, with the result that the output circuits OUT21, OUT22, OUT23, OUT24 output signals simultaneously to the signal lines S1, S2, S3, S4, respectively.

At this time, to simultaneously drive two rows of the output circuits OUT21, OUT22, OUT23, OUT24 diagonally adjacent to one another, the address pulse is supplied simultaneously to two rows of address wiring line ADD34 connected to the address transistors AD21, AD23 and address wiring line ADD 23 connected to the address transistors AD22, AD24.

Similarly, the reset pulse is supplied simultaneously to two rows of reset wiring line RSL34 connected to the reset transistors RS21, RS23 and reset wiring line RSL23 connected to the reset transistors RS22, RS24.

Next, the operation of the CMOS image sensor of FIG. 1 will be explained. First, before a transfer operation, a reset pulse is input to turn on the reset transistors RS21 to RS24, thereby resetting the floating junctions FJ21 to FJ24 to the reset drain voltage. Thereafter, before the signal charge is transferred to the floating junction FJ21 to FJ24, the reset transistors RS21 to RS24 are turned off, which brings the floating junctions FJ21 to FJ24 into the floating state. When the signal charge has been transferred to the floating junctions FJ21 to FJ24, their potentials vary, thereby modulating the channel potentials of the driving transistors D21 to D24 connected to the respective junctions. Then, to cause the output circuits OUT21 to OUT24 to operate, an address pulse is supplied to the address wiring lines ADD23, ADD34, thereby turning on the address transistors AD21 to AD24. As a result, the potentials corresponding to the signal charges at the photodiodes PD31 to PD34 are output to the signal lines S1 to S4 respectively.

Figure 2:
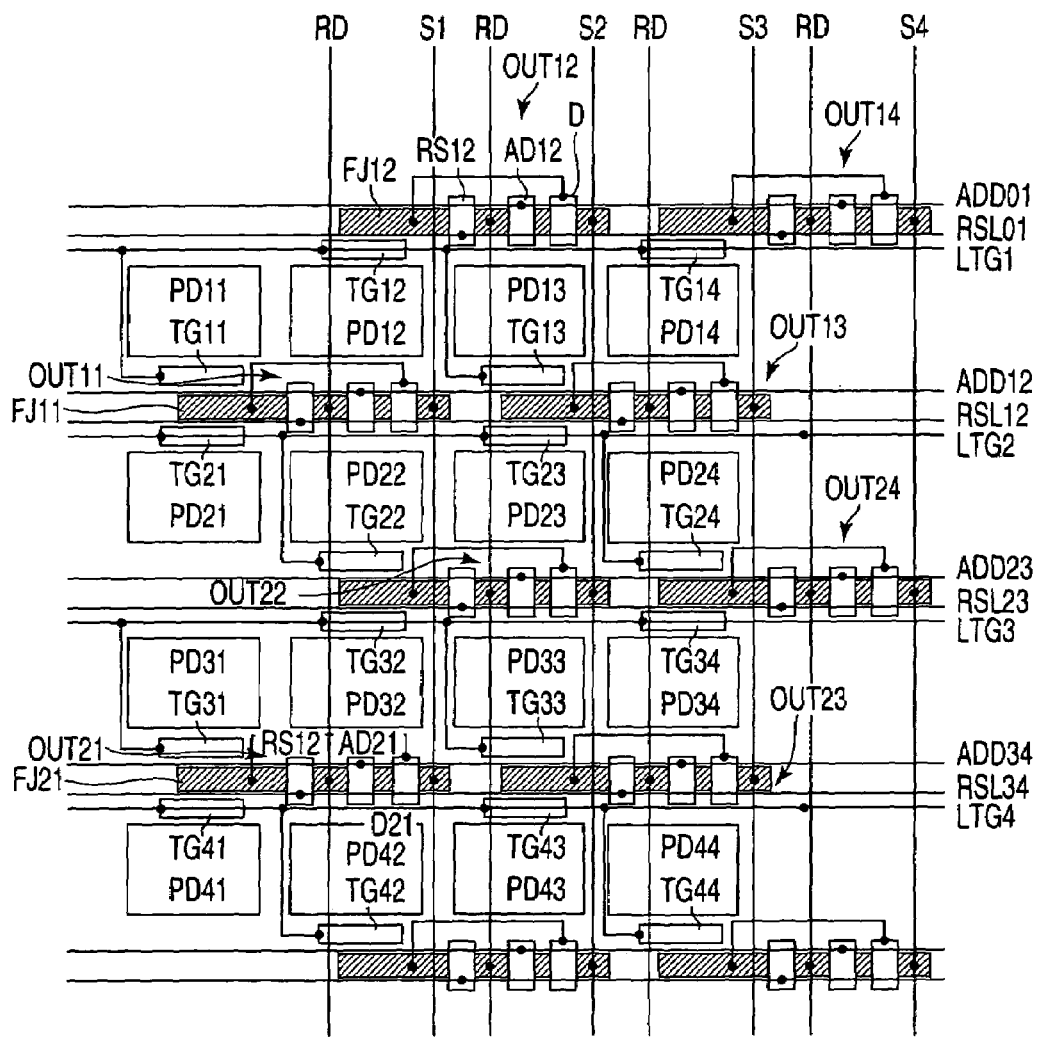
FIG. 2 shows a concrete pattern layout of the CMOS image sensor of FIG. 1.

FIG. 2 shows a concrete pattern layout of the CMOS image sensor of FIG. 1. The photodiodes PD11 to PD44 acting as pixels are arranged two-dimensionally with a specific horizontal pitch and a specific vertical pitch. The photodiodes PD11 to PD44 are isolated from one another in the horizontal direction. Transfer gates TG11 to TG44, floating junctions FJ11, FJ21, . . . , and output circuits OUT11 to OUT14, OUT21 to OUT24 are provided so as to extend from the spacing between photodiodes PD11 and PD21, PD12 and PD22, PD13 and PD23, PD14 and PD24, PD31 and PD41, PD32 and PD42, PD33 and PD43, PD34 and PD44 vertically adjacent to each other each making a pair to the spacing between photodiodes making a pair horizontally adjacent to the preceding pairs of photodiodes. The transfer gates TG11 to TG44 and floating junctions FJ11, FJ21 are provided in the spacing between the photodiodes which are vertically adjacent to each other making a pair and are to read from. The output circuits OUT11 to OUT14, OUT21 to OUT24 are located in a position adjacent to the spacing in the vertical direction of the photodiode pair horizontally adjacent to the photodiode pair to be read from, with the photodiodes horizontally adjacent to one another being read vertically in a staggered manner. These output circuits OUT11 to OUT 14, OUT21 to OUT24 are shared by the pairs of photodiodes vertically adjacent to each other. One of the pair of photodiodes selectively outputs information externally.

A detailed explanation below will be given using the third line. In the spacing between photodiodes (or pixels) PD31, PD41 vertically arranged so as to make a pair, the transfer gates TG31, TG41 and the floating junction FJ21 are provided. The signal charge at the pair of photodiodes PD31, PD41 is accumulated in the floating junction FJ21 via the transfer gates TG31, TG41. The transistors RS21, AD21, D21 constituting the output circuit OUT21 are formed in the spacing between the pair of photodiodes PD22, PD32 and the pair of photodiodes PD42, PD52 (not shown) diagonally adjacent to the output circuit OUT21 (or in the spacing between photodiodes PD32, PD42 making a pair in the vertical direction). Therefore, the transfer transistor TG32 for the photodiode PD32 horizontally adjacent to the photodiode PD21 is provided in the spacing between photodiodes PD22, PD32 making a pair. That is, the direction of transfer of signal charge in photodiodes horizontally adjacent to each other alternates between up and down positions in a staggered manner.

With the above configuration, the photodiodes are arranged two-dimensionally with a specific horizontal pitch and a vertical pitch and each of the output circuits is provided in the spacing between photodiodes vertically adjacent to each other making a pair and in the spacing between photodiodes making a pair diagonally adjacent to the output circuit, the photodiodes (or pixels) can be arranged with a narrow pitch in the horizontal direction, which enables high integration in the horizontal direction.

SECOND EMBODIMENT

FIG. 3 is a diagram to help explain a solid-state image pickup device according to a second embodiment of the present invention, showing another concrete pattern layout of the circuit configuration of FIG. 1. In FIG. 3, the same component parts as those in FIGS. 1 and 2 are indicated by the same reference numbers and a detained explanation of them will be omitted.

A CMOS image sensor of the second embodiment is such that the address transistors (or address gates) AD11 to AD14, AD21 to AD24 are removed from the output circuits OUT11 to OUT14, OUT21 to OUT24 of the first embodiment, respectively.

Specifically, each of the output circuits OUT11 to OUT14, OUT21 to OUT24 is composed of a reset transistor RS and a driving transistor D. The reset transistor RS has one end of its current path connected to transfer gate pairs TG11 to TG14, TG21 to TG24 and the other end of its current path connected to a reset drain RD. Reset wiring lines RSL0 to RSL34 supply reset signals to the gate of the reset transistor RS. The driving transistor D has one end of its current path connected to the reset drain RD, the other end of its current path connected to signal lines S1 to S4, and its gate connected to one end of the current path of the reset transistor RS.

A structure where the address gates have been removed has been disclosed in, for example, "IEEE Journal of Solid State Circuits," Vol. 39, No. 12, December 2004, pp. 2408-2416.

The CMOS image sensor operates as follows. In a state where a low-level pulse is applied to the reset drain RD, a high-level reset pulse is applied to the reset line RSL, bringing the floating junction FJ to a low level. For example, when the photodiode pairs PD31 to PD34 in the third line are read from, a reset pulse is applied to the reset lines RSL23, RSL34 at the same time. Then, with the gate of the driving transistor D in the low level, the reset drain RD is made high for normal driving and the gate of the reset transistor RS of the line to be selected is made high, thereby resetting the floating junction FJ. Thereafter, the transfer gate TG of the photodiode pair PD to be selected is opened, causing the gate voltage of the driving transistor D to be modulated by the signal charge. At this time, the gates of the unselected driving transistors D are in the low level and the output of the selected driving transistor D is supplied to the signal lines S1 to S4.

Employing such a driving method makes it possible to eliminate the address transistors AD11 to AD14, AD21 to AD24.

Even with the above configuration, high integration in the horizontal direction can be realized as in the first embodiment.

THIRD EMBODIMENT

Figure 4:
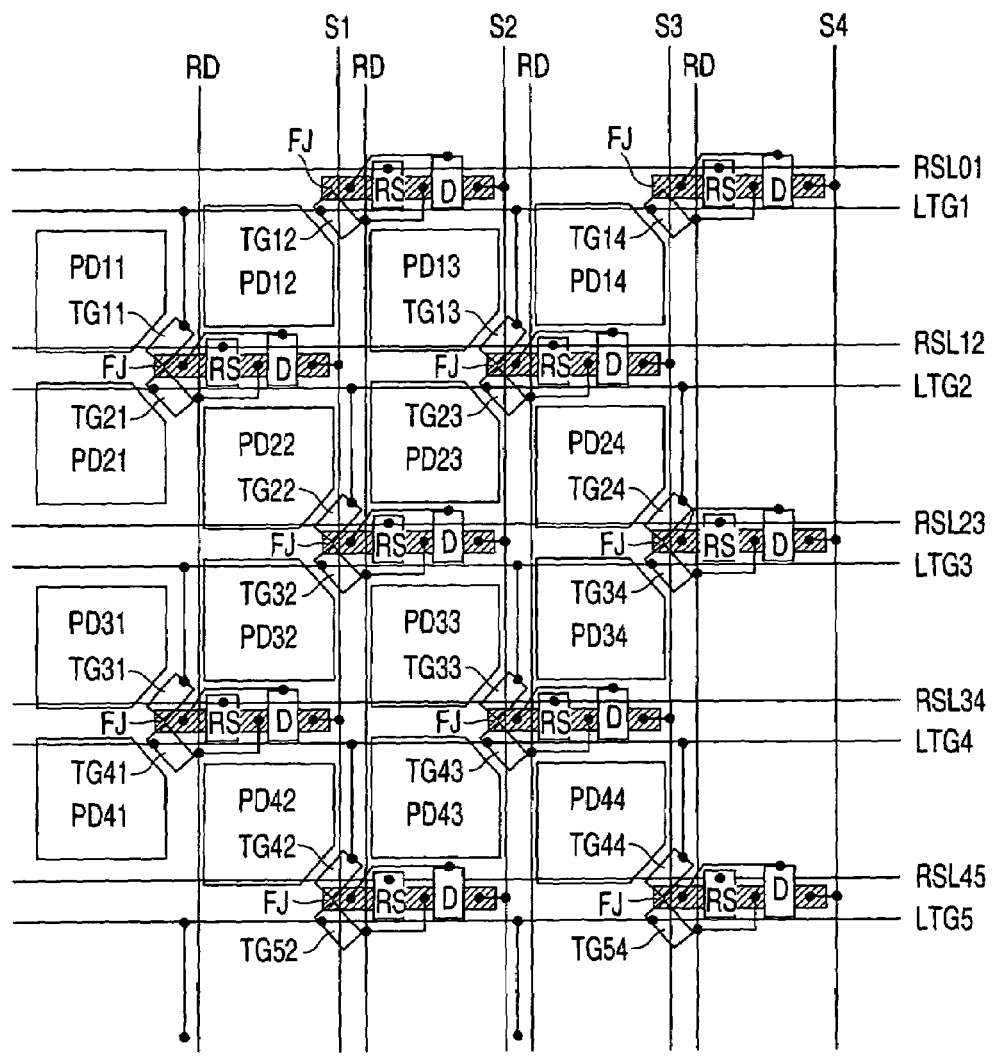
FIG. 4 is a diagram to help explain a solid-state image pickup device according to a third embodiment of the present invention, showing a plan view of still another concrete pattern layout of the CMOS image sensor of FIG. 1.

FIG. 4 is a diagram to help explain a solid-state image pickup device according to a third embodiment of the present invention, showing still another concrete pattern layout of the circuit configuration of FIG. 1. In FIG. 4, the same component parts as those in FIGS. 1 to 3 are indicated by the same reference numbers and a detained explanation of them will be omitted.

Specifically, a CMOS image sensor of the third embodiment is such that each of the pairs of transfer gates TG11 and TG21, TG13 and TG23, TG22 and TG32, TG24 and TG34, TG31 and TG41, TG33 and TG43, TG42 and TG52, TG44 and TG54 is inclined at about 45 degrees to the horizontal direction so as to face each other (that is, transfer gates making a pair are provided so as to face each other in such a manner that one of the pair is inclined at virtually +45 degrees to the horizontal direction and the other of the pair is inclined at virtually −45 degrees to the horizontal direction). Each floating junction FJ is placed in an area enclosed by the vicinity of the crossed part of the transfer gate pair and the reset transistor RS.

With this arrangement, the vertical spacing in each photodiode pair is occupied by only the element isolating region, enabling the photodiode pair to be extended toward the element isolating region, which makes it possible to increate the occupied area of the is photodiode pair.

In the pattern layout of FIG. 4, the photodiode pair are enclosed by the element isolating regions in three directions and the element isolating region of the output circuit is arranged only in one direction. In the element isolating regions in the three directions, for example, an impurity region formed by ion implantation may be used. When incident light is gathered by microlenses formed so as to correspond to the individual pixels as widely used in a conventional image sensor, the incident light does not form an image at the corner of the pixels in the diagonal direction, with the result that the picture quality deteriorates less at the transfer gates diagonally arranged as shown in FIG. 4 than in a conventional configuration.

While in FIG. 4, the transfer gates are arranged diagonally, they may be arranged in another direction. For instance, in the pattern layouts shown in FIGS. 2 and 3, the transfer gates may be provided at the corner of a photodiode to make the length of the floating junction shorter so that the transfer gate may be arranged in the spacing part of the photodiode in the diagonal direction.

FOURTH EMBODIMENT

Figure 5:
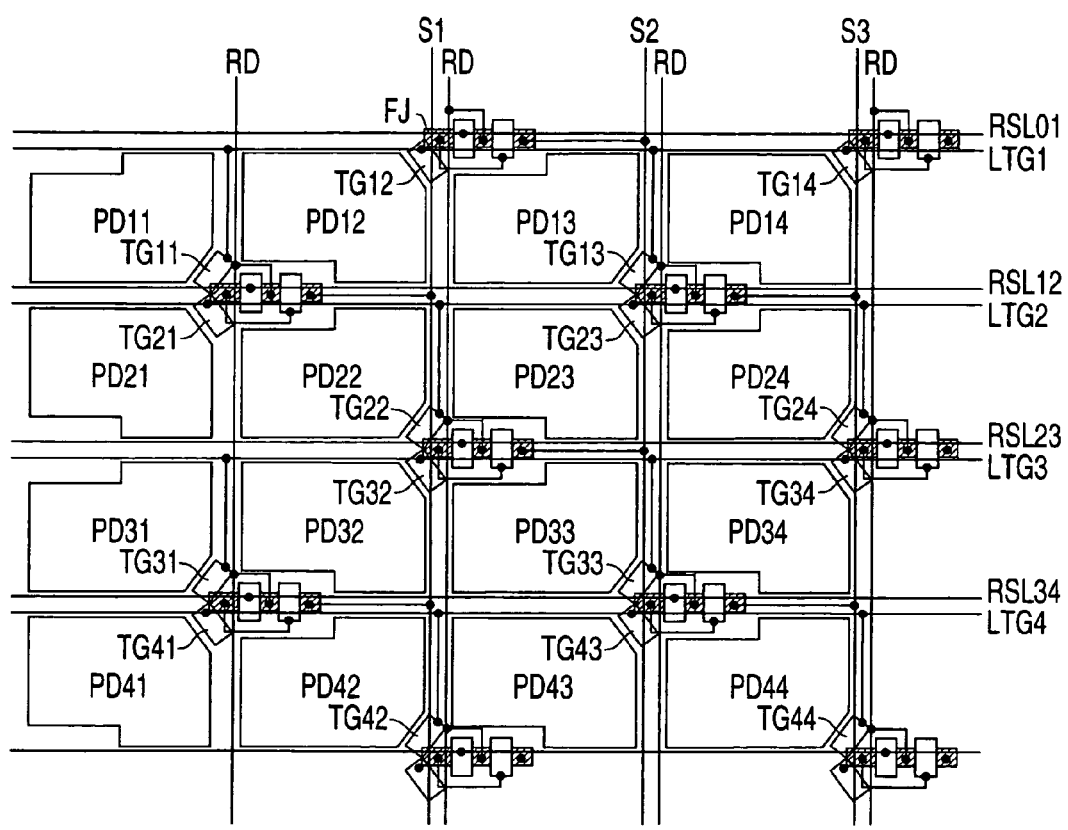
FIG. 5 is a diagram to help explain a solid-state image pickup device according to a fourth embodiment of the present invention, showing a plan view of another concrete pattern layout of the circuit configuration of FIG. 1.

FIG. 5 is a diagram to help explain a solid-state image pickup device according to a fourth embodiment of the present invention, showing still another concrete pattern layout of the circuit configuration of FIG. 1. In FIG. 5, the same component parts as those in FIGS. 1 to 4 are indicated by the same reference numbers and a detained explanation of them will be omitted.

Specifically, a CMOS image sensor of the fourth embodiment is effective when the length of the output circuit horizontally extending can be designed to be shorter than the horizontal pitch of pixels. The layout of the CMOS image sensor is such that a part of the spacing between output circuits vertically adjacent to each other is made just the same as the width of the element isolating region. With this structure, the area of the charge accumulation part of the pixels can be increased more.

In the fourth embodiment, in addition to the element isolating region in the horizontal direction, the spacing between pixels in the vertical direction is occupied by only the element isolating region excluding the output circuit. The element isolating region can be formed by ion implantation. Since the output circuit can be provided collectively at the corner of the pixels, the elements in the output circuit can be isolated by only ion-implanted element isolating regions, instead of forming a thick oxide film for element isolation.

FIFTH EMBODIMENT

Figure 6:
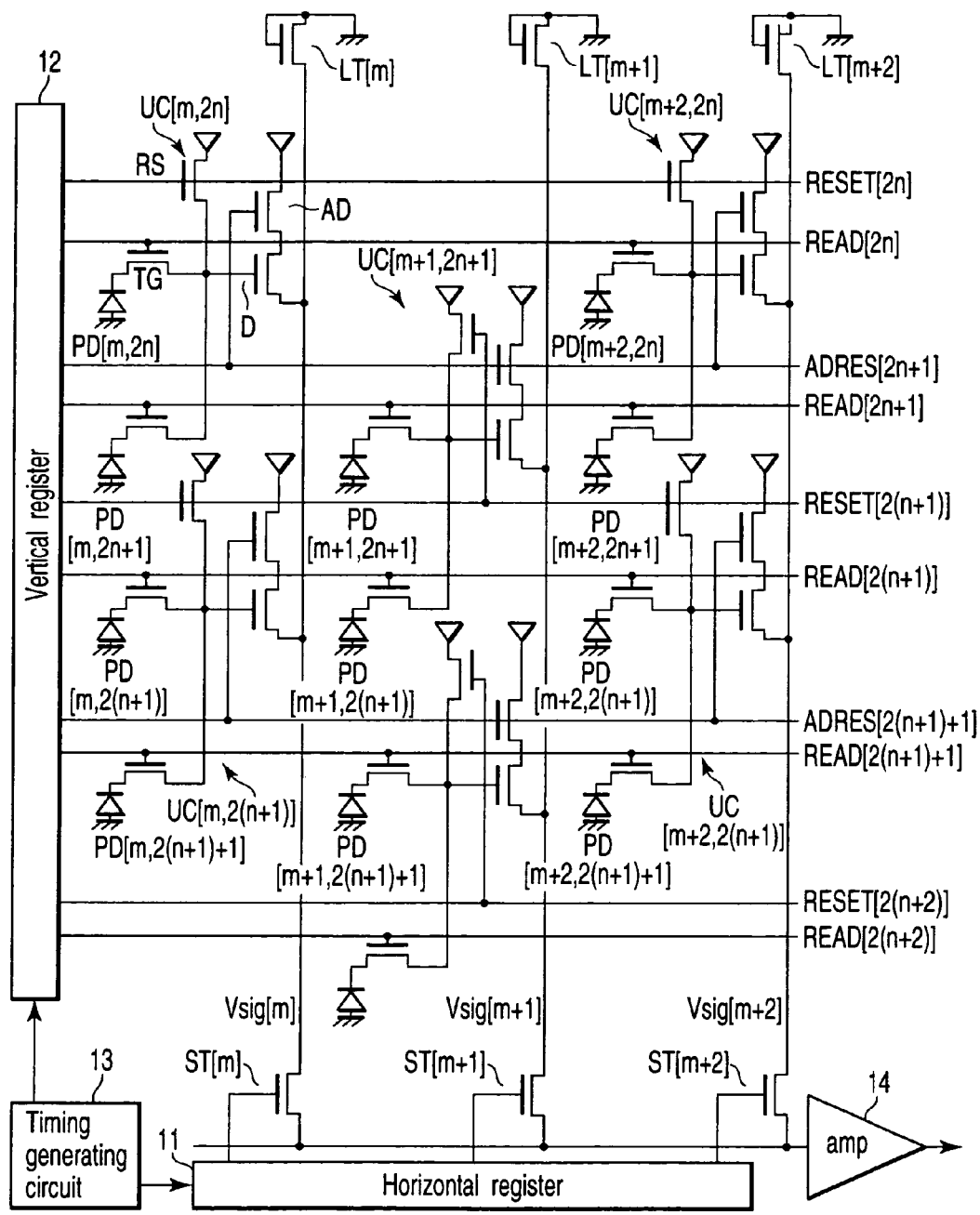
FIG. 6 is a circuit diagram to help explain a solid-state image pickup device according to a fifth embodiment of the present invention, showing the main part of a CMOS image sensor.

FIG. 6 is a circuit diagram to help explain a solid-state image pickup device according to a fifth embodiment of the present invention, showing the main part of a CMOS image sensor. The CMOS image sensor includes unit cells UC, load transistors LT, select transistors ST, a horizontal register 11, a vertical register 12, a timing generating circuit 13, and an amplifier (amp) 14. The unit cells UC are arranged in (2n to 2(n+1)+2) rows×(m to m+2) columns. Each of the unit cells UC includes a photodiode PD, a transfer transistor TG, a reset transistor RS, an address transistor AD, and a driving transistor D.

The photodiode pair PD has its anode grounded and its cathode connected to one end of the current path of each of the transfer transistor pair TG. Read signal lines READ are connected to the gates of the transfer transistor pair TG. The vertical register 12 supplies a read signal to the gates. The other ends of the current paths of the transfer transistor pair TG are connected equally to the gate of the driving transistor D. The current path of the reset transistor RS is connected between the gate of the driving transistor D and the potential supply source. A reset signal line RESET is connected to the gate of the reset transistor RS. The vertical register 12 supplies a reset signal to the gate. The current path of the address transistor AD is connected between one end of the current path of the driving transistor D and the potential supply source. An address signal line ADRES is connected to the gate of the address transistor AD. The vertical register 12 supplies an address signal. The other end of the current path of the driving transistor D is connected to a vertical signal line Vsig. The vertical signal line Vsig is provided in a direction crossing the reset signal line RESET, the address signal line ADRES, and the read signal line READ.

The current path of the load transistor LT is connected between one end of the vertical signal line Vsig and the ground point. The current path of the select transistor ST is connected between the other end of the vertical signal line Vsig and the input terminal of the amplifier 14. The output signal of the horizontal register 11 is supplied to the gates of these transistors ST, thereby controlling the transistors ST. The operation timing of the vertical register 12 and horizontal register 11 are designed to be controlled by the output signal of the timing generating circuit 13.

Specifically, the CMOS image sensor of the fifth embodiment is characterized by using one address line ADRES and one reset line RESET running in a lateral direction for every two lines. With this structure, the number of driving lines running laterally can be reduced from three per line to two per line. Therefore, the structure is advantageous to a case where "the sensitivity decreases as a result of light being shut out by metal wiring" as often found when pixels are miniaturized.

Figure 7:
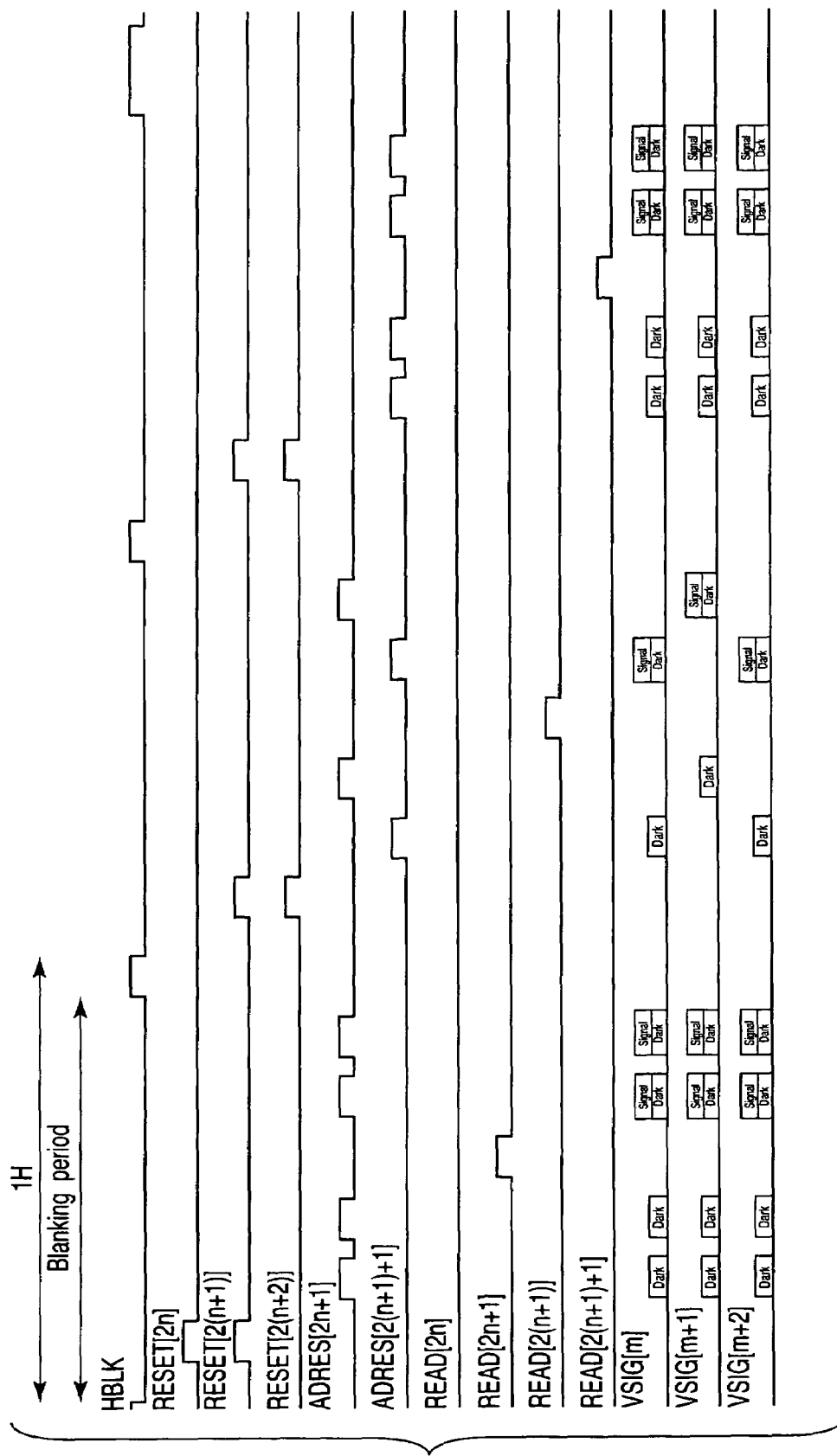
FIG. 7 is a timing chart to help explain the operation of driving the CMOS image sensor of FIG. 6.

FIG. 7 is a timing chart to help explain the operation of driving the solid-state image pickup device of the fifth embodiment. Using FIG. 7, a case where the signal charges are read from the pixels (or photodiodes PD) in a (2n+1)-th line and a 2(n+1)-th line of a CMOS image sensor of the fifth embodiment will be explained. First, a reset signal line RESET[2n] and a reset signal line RESET[2(n+1)] are made high, thereby resetting the floating junctions corresponding to the pixels in the (2n+1)-th line. Then, an address signal ADRES[2n+1] is made high, thereby activating the source follower circuit corresponding to the (2n+1)-th line. Then, the dark level of the pixels in the (2n+1)-th line is read.

Then, the read signal line READ [2n+1] is made high, thereby turning on the transfer transistor TG corresponding to the pixels in the (2n+1)-th line, which causes the signal charges accumulated in the pixels to be read into the floating junctions. Next, the address signal line ADRES [2n+1] is made high, thereby activating the source follower circuit corresponding to the pixels in the (2n+1)-th line, which causes the signals at the pixels in the (2n+1)-th line to be read. Therefore, by finding the difference from the previously read dark level outside the pixels, only the signal level of the (2n+1)-th line can be extracted.

Next, the reset signal line RESET[2(n+1)] and the reset signal line RESET[2(n+2)] are made high, thereby resetting the floating junctions corresponding to the pixels in the 2(n+1)-th line. Then, the address signal line RESET[2(n+1)+1] is made high, activating the source follower circuits for those corresponding to the even-numbered columns among the pixels in the 2(n+1)-th line, which reads the dark level of the pixels in the even-numbered columns in the 2(n+1)-th line. Then, the address signal line ADRES[2n+1] is made high, activating the source follower circuits for those corresponding to the odd-numbered columns among the pixels in the 2(n+1)-th line, which reads the dark level of the pixels in the odd-numbered columns in the 2(n+1)-th line.

Then, the read signal line READ [2(n+1)] is made high, thereby turning on the transfer transistor TG corresponding to the pixels in the 2(n+1)-th line, which causes the signal charges accumulated in the pixels to be read into the floating junctions. Next, the address signal line ADRES [2(n+1)+1] is made high, thereby activating the source follower circuit corresponding to the pixels in the even-numbered columns in the 2(n+1)-th line, which causes the signals at the pixels in the even-numbered columns in the 2(n+1)-th line to be read. Then, the address signal line ADRES[2n+1] is made high, activating the source follower circuit corresponding to the pixels in the odd-numbered columns in the 2(n+1)-th line, which causes the signals at the pixels in the odd-numbered columns in the 2(n+1)-th line to be read. These signals are the sum of the dark level and the signal level. Therefore, by finding the difference from the previously read dark level outside the pixels, only the signal level of the 2(n+1)-th line can be extracted.

Figure 8:
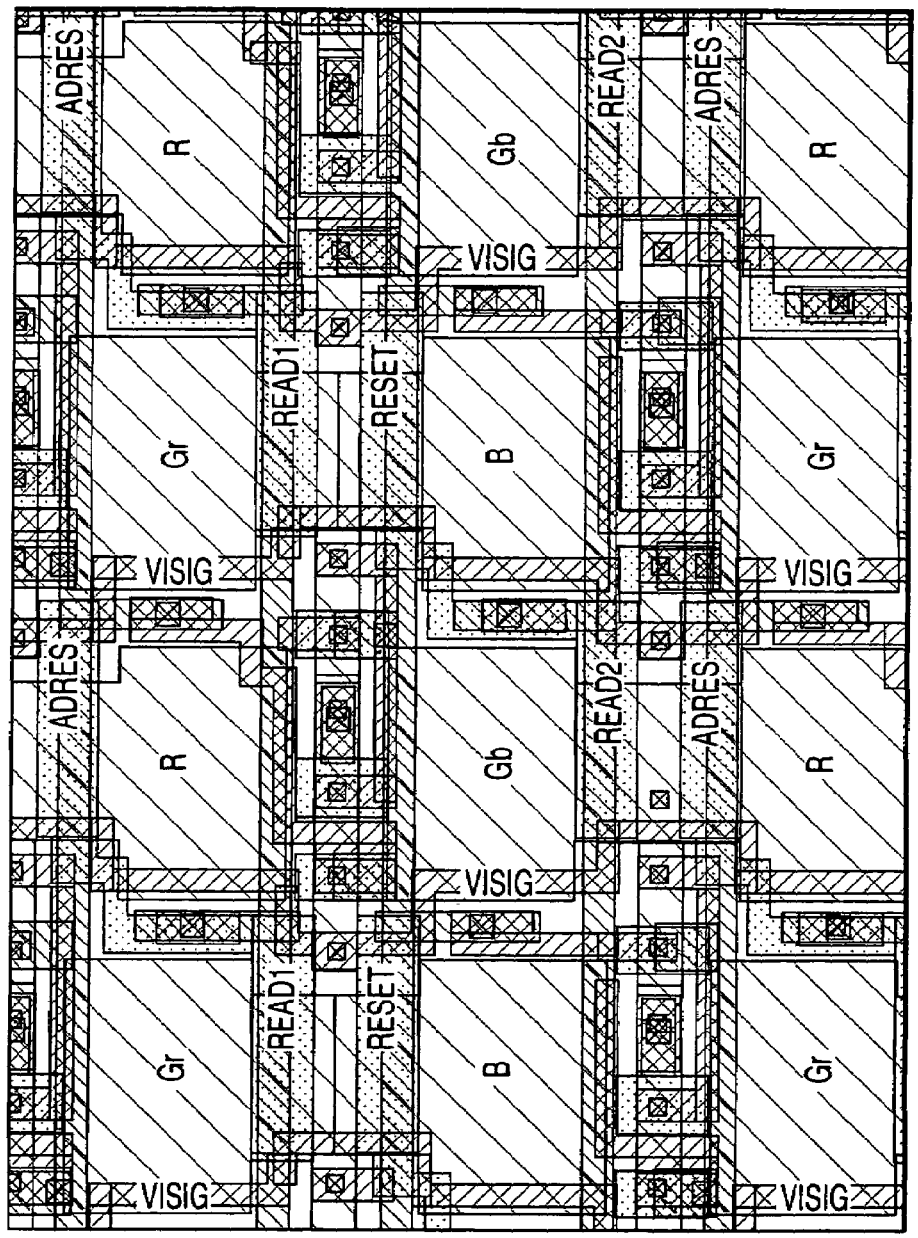
FIG. 8 is a plan view showing a pattern layout of the CMOS image sensor of FIG. 6.

FIG. 8 is a plan view showing a pattern layout of the CMOS image sensor of FIG. 6. Two metal interconnections (or two-layer aluminum), which are provided for every one line, are configured to shut out less light.

In this configuration, the component elements in the horizontal direction are photodiodes and element isolating regions. The interconnections running over the element isolating regions may be metal interconnections used to shut out light. Therefore, in practice, only the element isolating regions are present between photodiodes in the horizontal direction near the surface of the substrate. Since there is no gate interconnection on the element isolating region, it is not necessary to use an element isolating region with a thick oxide film as in a conventional equivalent. Since the element isolating regions are formed by impurity ion implantation, high integration can be achieved.

Furthermore, as for the vertical pitch, the spacing between pixels is configured to include either a read section composed of "two read gates (or transfer gates)+one floating junction" or an output circuit section composed of "one address transistor+one driving transistor+one reset transistor" as described above. These widths can be made almost equal. In addition, providing unit cells in a checkered pattern enables the read section and the output circuit section to be located horizontally adjacent to each other. Effective use of the vertical spacing between pixels helps achieve high integration.

Particularly for use in digital cameras or camera phones, the pixels must be arranged in a square-lattice pattern. Accordingly, the openings for the pixels are required to be made at as equal intervals as possible. According to the invention, the horizontal pixel pitch and vertical pixel pitch can be made shorter, which makes it possible to simplify the pattern layout of unit cells and realize high integration.

SIXTH EMBODIMENT

Modifying the circuit of FIG. 6 so as to have the structure with no address transistor explained in the second embodiment enables the area occupied by the output circuits to be decreased more. At this time, the address signal lines ADRES (address signals) corresponding to the eliminated address transistors are reduced and the number of reset signal lines RESET (reset signals) is increased by just that much.

Figure 9:
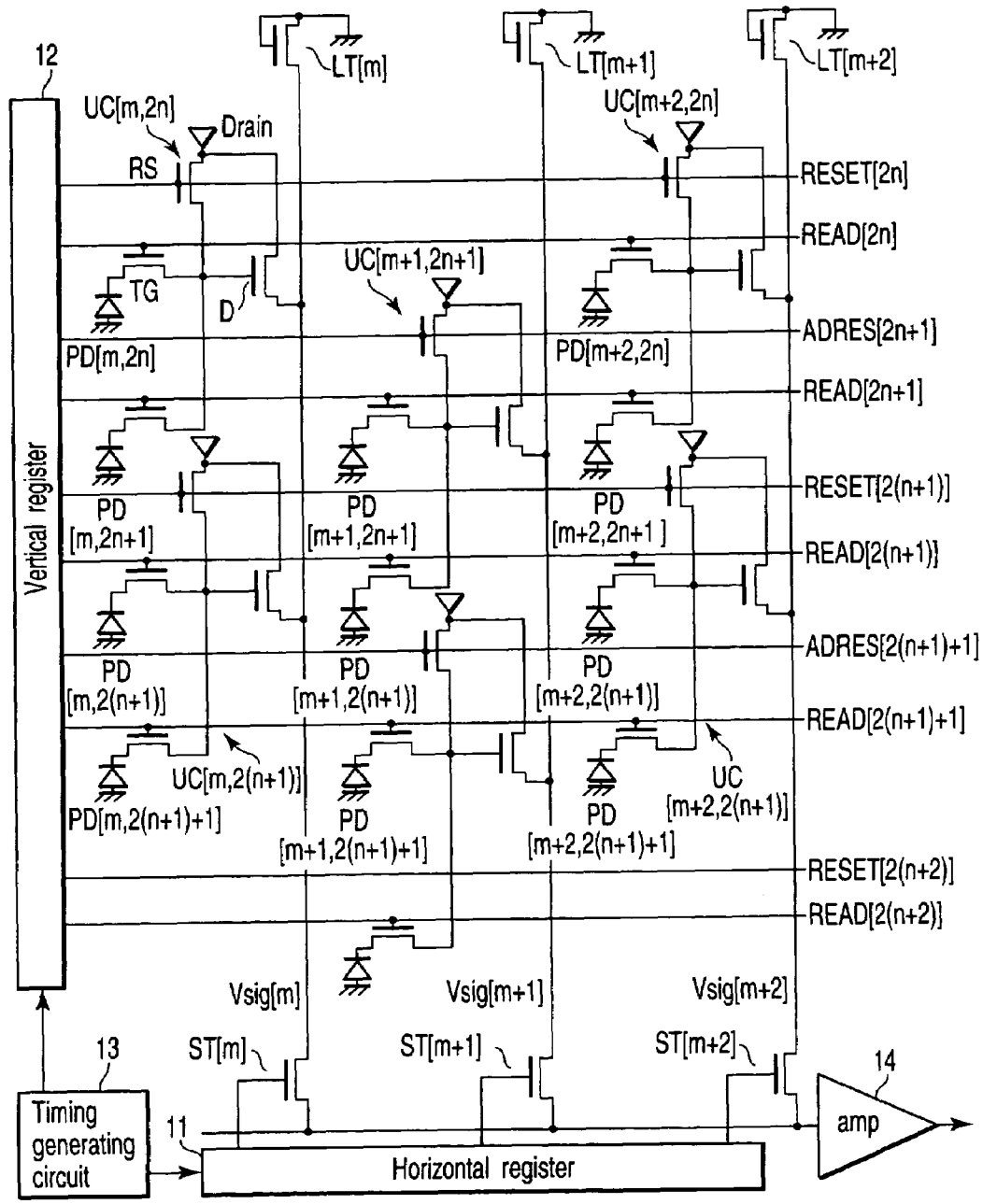
FIG. 9 is a circuit diagram to help explain a solid-state image pickup device according to a sixth embodiment of the present invention, showing the main part of a CMOS image sensor.

FIG. 9 is a circuit diagram to help explain a solid-state image pickup device according to a sixth embodiment of the present invention. The same component parts as those in FIG. 6 are indicated by the same reference numbers. What differs from the fifth embodiment of FIG. 6 is that the address transistor AD in each unit cell is eliminated and one end of the current path of the driving transistor D is connected directly to the potential supply source (Drain).

Like the circuit of FIG. 6, the CMOS image sensor includes unit cells UC, load transistors LT, select transistors ST, a horizontal resister 11, a vertical register 12, a timing generating circuit 13, and an amplifier (amp) 14. The unit cells UC are arranged in (2n to 2(n+1)+1) rows×(m to m+2) columns.

Each of the unit cells UC includes a photodiode PD, a transfer transistor TG, a reset transistor RS, and a driving transistor D.

The photodiode pair PD has its anode grounded and its cathode connected to one end of the current path of each of the transfer transistor pair TG. Read signal lines READ are connected to the gates of the transfer transistor pair TG. The vertical register 12 supplies a read signal to the gates. The other ends of the current paths of the transfer transistor pair TG are connected equally to the gate of the driving transistor D. The current path of the reset transistor RS is connected between the gate of the driving transistor D and the potential supply source. A reset signal line RESET is connected to the gate of the reset transistor RS. The vertical register 12 supplies a reset signal to the gate. The other end of the current path of the driving transistor D is connected to a vertical signal line Vsig. The vertical signal line Vsig is provided in a direction crossing the reset signal line RESET, the address signal line ADRES, and the read signal line READ.

That is, the CMOS image sensor of the sixth embodiment is characterized by eliminating address signal lines ADRES and providing one reset signal line RESET running in a lateral direction for every line. With this structure, the number of driving lines running in a lateral direction remains unchanged at a rate of two driving lines per line.

Figure 10:
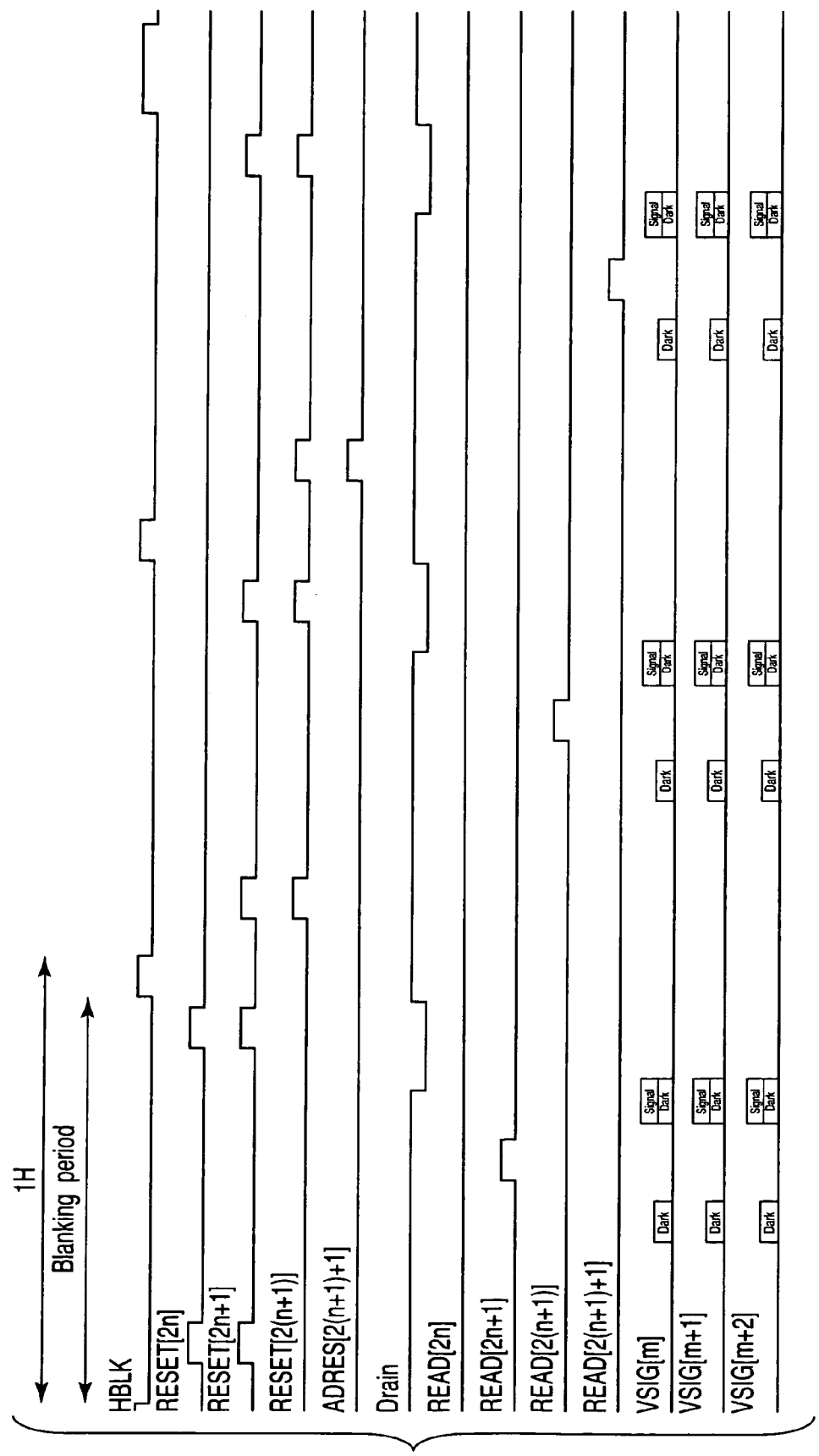
FIG. 10 is a timing chart to help explain the operation of driving the CMOS image sensor of FIG. 9.

FIG. 10 is a timing chart to help explain the operation of driving the solid-state image pickup device of the sixth embodiment. Using FIG. 10, a case where the signal charges are read from the pixels (or photodiodes PD) in a (2n+1)-th line and a 2(n+1)-th line of the CMOS image sensor of the sixth embodiment will be explained. First, a reset signal line RESET[2n] and a reset signal line RESET[2(n+1)] are made high, thereby resetting the floating junctions corresponding to the pixels in the (2n+1)-th line. At this time, the driving transistor D connected to the floating junctions goes high, activating the source follower circuit corresponding to the pixels in the (2n+1)-th line, which causes the dark level of the pixels in the (2n+1)-th line to be read.

Then, the read signal line READ [2n+1] is made high, thereby turning on the transfer transistor TG corresponding to the pixels in the (2n+1)-th line, which causes the signal charges accumulated in the pixels to be read into the floating junctions. At this time, the driving transistor connected to the floating junction remains high although being modulated by the signal charge and the source follower circuit corresponding to the pixels in the (2n+1)-th line remains activated. In this state, the signal at the pixels in the (2n+1)-th line are read. The signal is the sum of the dark level and the signal level. Therefore, by finding the difference from the previously read dark level outside the pixels, only the signal level of the (2n+1)-th line can be extracted.

Next, the potential of the power supply source Drain is made low. In this state, the reset signal line RESET [2n] and the reset signal line RESET [2n+1] are made high, bringing the floating junctions corresponding to the pixels in the (2n+1)-th line into the low level, which causes the driving transistor to cut off, with the result that the source follower circuits corresponding to the unit cells UC[m, 2n], UC[m+2, 2n] in the 2n-th line and the unit cells UC[m+1, 2n+1] in the (2n+1)-th line go into the deactivated state. It is when RESET[2n] goes high to read the pixels in the 2n-th line a time corresponding to one frame later that the source follower circuit for the unit cells in the 2n-th line returns to the activated state. In the meantime, the source follower circuit is kept in the deactivated state. Next, RESET[2n+1] and RESET[2(n+1)] are made high, activating the unit cell UC[m+1, 2n+1] again, which activates the unit cell UC[m, 2(n+1)] and the unit cell UC[m+2, 2(n+1)]. Then, the read signal line READ[2(n+1)]

is made high, reading the signal charges accumulated in the pixels in the 2(n+1)-th line to be read into the floating junctions. From this time on, the same reading sequence as that of the pixels in the (2n+1)-th line is repeated.

By configuring the unit cells as described above, there is no need to read signals with complex timing as described in FIG. 7, that is, read signals several times by carrying out a plurality of addressing operations in one horizontal blanking period, which makes it possible to drive the pixels by a similar driving method to a conventional one. Moreover, according to the present invention, the horizontal pixel pitch and vertical pixel pitch can be made shorter, which enables the pattern layout of unit cells to be simplified and high integration to be realized.

The invention is not limited to the above embodiments. As explained in the third and fourth embodiments, the floating junction part is arranged in the spacing in an oblique direction of the pixels and the read gate is arranged obliquely, which enables higher integration. Specifically, effective use of the spacing between pixels diagonally adjacent to each other allows the spacing between pixels in the vertical direction with no output circuit to be occupied by only an element isolating region, which makes it possible to increase the area of pixels vertically adjacent to each other in the element isolating region.

In the structured where an output circuit is at the corner of the pixels, when incident light is caused to form an image on the pixels by microlenses, the light is gathered in a circle at the pixel section. Therefore, even when there is an output circuit at the corner of the pixel section, the eclipse of incident light by the output circuit section is small.

Furthermore, since there is no output circuit section in the horizontal direction, the opening in the horizontal direction can be made wider, with the result that the opening becomes horizontally long. Since the opening has a horizontally long structure where the ratio of breadth to length in the number of pixels is generally 4:3 or 16:9, a horizontally long opening for pixels can realize a structure less liable to be affected by shading. This offers a great advantage over a vertically long pixel opening in a conventional CMOS area sensor where the output circuits are provided at the side of the pixels or a CCD area sensor where the vertical CCD registers have to be provided at the side of the pixels.

In the embodiments, 2×2, or 4, pixels form one repeat unit. Since the structure is the same as that of repeat units where three primary colors, R, G, B, are arranged in 2×2, or 4, pixel units in an existing Bayer arrangement color filter, periodic irregularity due to differences in an iterative arrangement does not occur. Moreover, two greens in the Bayer arrangement are arranged in a checkered pattern. In this structure, too, the pixels lying in the checkered pattern have the same structure, which prevents irregularity from being caused even with two greens.

Furthermore, as having achieved satisfactory results in a CCD area sensor, the method of forming element isolating regions by ion implantation can suppress the occurrence of crystal defects in a semiconductor substrate more than a method of forming thick oxide films and further suppress flaws caused by junction leaks, which enables the improvement of image quality to be expected.

As described above, according to one aspect of this invention, it is possible to provide a solid image pickup device capable of achieving high integration in the horizontal direction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image pickup device comprising:
a group of pixels where pixels are arranged substantially in a matrix with a specific vertical pitch and a specific horizontal pitch, wherein each two pixels vertically adjacent to each other form a pair, and each two pairs of pixels that are horizontally adjacent to each other are arranged to have a positional difference in a vertical direction by substantially one pitch; and
a group of output circuits arranged in a checkered pattern, each of which is provided so as to extend from a spacing part located between the pixels forming said pair to one of spacing parts each located between vertically-lined two pairs of pixels that are horizontally adjacent to the pixels forming said pair, and which is configured to externally output information corresponding to a signal charge read from selected one of the pixels forming said pair.

2. The solid-state image pickup device according to claim 1, further comprising a floating junction which is provided in the spacing part located between the pixels forming said pair and to which the signal charge generated at the pair of pixels is transferred and which accumulates the signal charge, and a pair of transfer gates which is provided between the pair of pixels and the floating junction and controls the transfer of signal charge from the pair of pixels to the floating junction,
wherein the output circuit is provided in the spacing part located between vertically-lined two pairs of pixels of four pairs of pixels that are diagonally adjacent to the pixels forming said pair.

3. The solid-state image pickup device according to claim 2, wherein horizontally arranged pixels are read from by opening one of the pairs of transfer gates simultaneously and transferring the charge to the corresponding output circuits.

4. The solid-state image pickup device according to claim 1, further comprising a floating junction which is provided in the spacing part located between the pixels forming said pair and at the end where the output circuit is provided and to which the signal charge generated at the pair of pixels is transferred and which accumulates the signal charge, and a pair of transfer gates which is provided at the corner of a pair of pixels so as to face the floating junction and controls the transfer of signal charge from the pair of pixels to the floating junction,
wherein the output circuit is provided in the spacing part located between vertically-lined two pairs of pixels of four pairs of pixels that are diagonally adjacent to the pixels forming said pair.

5. The solid-state image pickup device according to claim 4, wherein the pixels arranged in the same horizontal line are read from by opening one of each of the pairs of transfer gates simultaneously and transferring the charge to the corresponding output circuits.

6. The solid-state image pickup device according to claim 4, wherein one of the pair of transfer gates is inclined at virtually +45 degrees to the horizontal direction and the other of the pair of transfer gates is inclined at virtually −45 degrees to the horizontal direction in such a manner that the transfer gates face each other, and
the floating junction is provided in a region enclosed by the vicinity of the crossed point of the pair of transfer gates and the output circuit.

7. The solid-state image pickup device according to claim 4, wherein the horizontal length of the output circuit is shorter than the horizontal pitch of pixels and a part of the spacing between output circuits vertically adjacent to each other is equal to the width of an element isolating region.

8. The solid-state image pickup device according to claim 7, wherein the pairs of pixels are isolated horizontally by element isolating regions and the pixel spacing parts excluding the output circuits are isolated vertically by element isolating regions.

9. The solid-state image pickup device according to claim 4, wherein the output circuit includes a reset transistor which has one end of its current path connected to the pair of transfer gates, the other end of its current path connected to a reset drain, and its gate supplied with a reset signal, an address transistor which has one end of its current path connected to the reset drain and its gate supplied with an address signal, and a driving transistor which has one end of its current path connected to the other end of the current path of the address transistor, the other end of its current path connected to a signal line, and its gate connected to one end of the current path of the reset transistor.

10. The solid-state image pickup device according to claim 9, further comprising a vertical register configured to supply a reset signal to the gate of the reset transistor, a read-out signal to the gates of the pair of transfer transistors, and an address signal to the gate of the address transistor.

11. The solid-state image pickup device according to claim 10, further comprising an amplifier which amplifies a signal and outputs the amplifier signal, a select transistor whose current path is connected between the input terminal of the amplifier and a signal line, a horizontal register which controls the select transistor, and a timing generating circuit which controls the operation timing of the vertical register and the horizontal register.

12. The solid-state image pickup device according to claim 4, wherein the output circuit includes a reset transistor which has one end of its current path connected to the pair of transfer gates, the other end of its current path connected to a reset drain, and its gate supplied with a reset signal, and a driving transistor which has one end of its current path connected to the reset drain, the other end of its current path connected to a signal line, and its gate connected to one end of the current path of the reset transistor.

13. The solid-state image pickup device according to claim 12, further comprising a vertical register configured to supply a reset signal to the gate of the reset transistor, a read-out signal to the gates of the pair of transfer transistors, and an address signal to the gate of an address transistor.

14. The solid-state image pickup device according to claim 13, further comprising an amplifier which amplifies a signal and outputs the amplifier signal, a select transistor whose current path is connected between the input terminal of the amplifier and a signal line, a horizontal register which controls the select transistor, and a timing generating circuit which controls the operation timing of the vertical register and the horizontal register.

15. The solid-state image pickup device according to claim 4, wherein the output circuit includes a reset transistor which has one end of its current path connected to a potential supply source and the other end of its current path connected to a pair of transfer gates and which resets the potential of the floating junction, an address transistor which has one end of its current path connected to the potential supply source and its gate supplied with an address signal, and a driving transistor which has one end of its current path connected to the other end of the current path of the address transistor, the other end of its current path connected to a signal line, and its gate connected to the pair of transfer gates.

16. The solid-state image pickup device according to claim 15, further comprising a vertical register configured to supply a reset signal to the gate of the reset transistor, a read-out signal to the gates of the pair of transfer gates, and an address signal to the gate of the address transistor.

17. The solid-state image pickup device according to claim 16, further comprising an amplifier which amplifies a signal and outputs the amplifier signal, a select transistor whose current path is connected between the input terminal of the amplifier and a signal line, a horizontal register which controls the select transistor, and a timing generating circuit which controls the operation timing of the vertical register and the horizontal register.

18. The solid-state image pickup device according to claim 4, wherein the output circuit includes a reset transistor which has one end of its current path connected to a potential supply source and the other end of its current path connected to a pair of transfer gates and which resets the potential of the floating junction, a driving transistor which has one end of its current path connected to the potential supply source, the other end of its current path connected to the signal line, and its gate connected to the pair of transfer gates.

19. The solid-state image pickup device according to claim 18, further comprising a vertical register configured to supply a reset signal to the gate of the reset transistor, and a read-out signal to the gates of the pair of transfer gates.

20. The solid-state image pickup device according to claim 19, further comprising an amplifier which amplifies a signal and outputs the amplifier signal, a select transistor whose current path is connected between the input terminal of the amplifier and a signal line, a horizontal register which controls the select transistor, and a timing generating circuit which controls the operation timing of the vertical register and the horizontal register.

* * * * *